United States Patent
Shinohara et al.

(10) Patent No.: US 7,859,279 B2
(45) Date of Patent: Dec. 28, 2010

(54) CHARGE ELIMINATING APPARATUS AND METHOD, AND PROGRAM STORAGE MEDIUM

(75) Inventors: Eiichi Shinohara, Nirasaki (JP); Kazuki Hanawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 305 days.

(21) Appl. No.: 11/861,905

(22) Filed: Sep. 26, 2007

(65) Prior Publication Data

US 2008/0100313 A1 May 1, 2008

(30) Foreign Application Priority Data

Nov. 1, 2006 (JP) ............................. 2006-297979
Mar. 13, 2007 (JP) ............................. 2007-063310
Sep. 17, 2007 (KR) ...................... 10-2007-0094236

(51) Int. Cl.
*G01R 31/26* (2006.01)
(52) U.S. Cl. .................................... 324/754; 324/158.1
(58) Field of Classification Search .............. 324/158.1, 324/750–765; 361/212, 220
See application file for complete search history.

(56) References Cited

U.S. PATENT DOCUMENTS

| | | | | | |
|---|---|---|---|---|---|
| 4,232,262 A | * | 11/1980 | Emo et al. | .................... | 324/722 |
| 4,885,543 A | * | 12/1989 | Smith | .......................... | 324/452 |
| 5,796,256 A | * | 8/1998 | Fowler et al. | ................ | 324/456 |
| 5,880,924 A | * | 3/1999 | Kumar et al. | ................ | 361/234 |
| 6,867,391 B2 | * | 3/2005 | Bodeau et al. | .............. | 219/209 |
| 7,221,172 B2 | * | 5/2007 | Dunklee | ..................... | 324/754 |
| 2004/0178788 A1 | * | 9/2004 | Suehira et al. | ........... | 324/158.1 |

FOREIGN PATENT DOCUMENTS

JP 2003-218175 7/2003

* cited by examiner

*Primary Examiner*—Vinh P Nguyen
(74) *Attorney, Agent, or Firm*—Oblon, Spivak, McClelland, Maier & Neustadt, L.L.P.

(57) ABSTRACT

A charge eliminating apparatus eliminates, when an electrical characteristics test of a target object is performed by moving a mounting table mounting the target object thereon and a probe card relative to each other to bring the target object into electrical contact with the probe card, static electricity of the target object via the mounting table. The charge eliminating apparatus includes a grounding wiring for grounding the mounting table; a relay switch disposed on the grounding wiring; and a switch controller that controls the relay switch to be opened or closed.

6 Claims, 4 Drawing Sheets

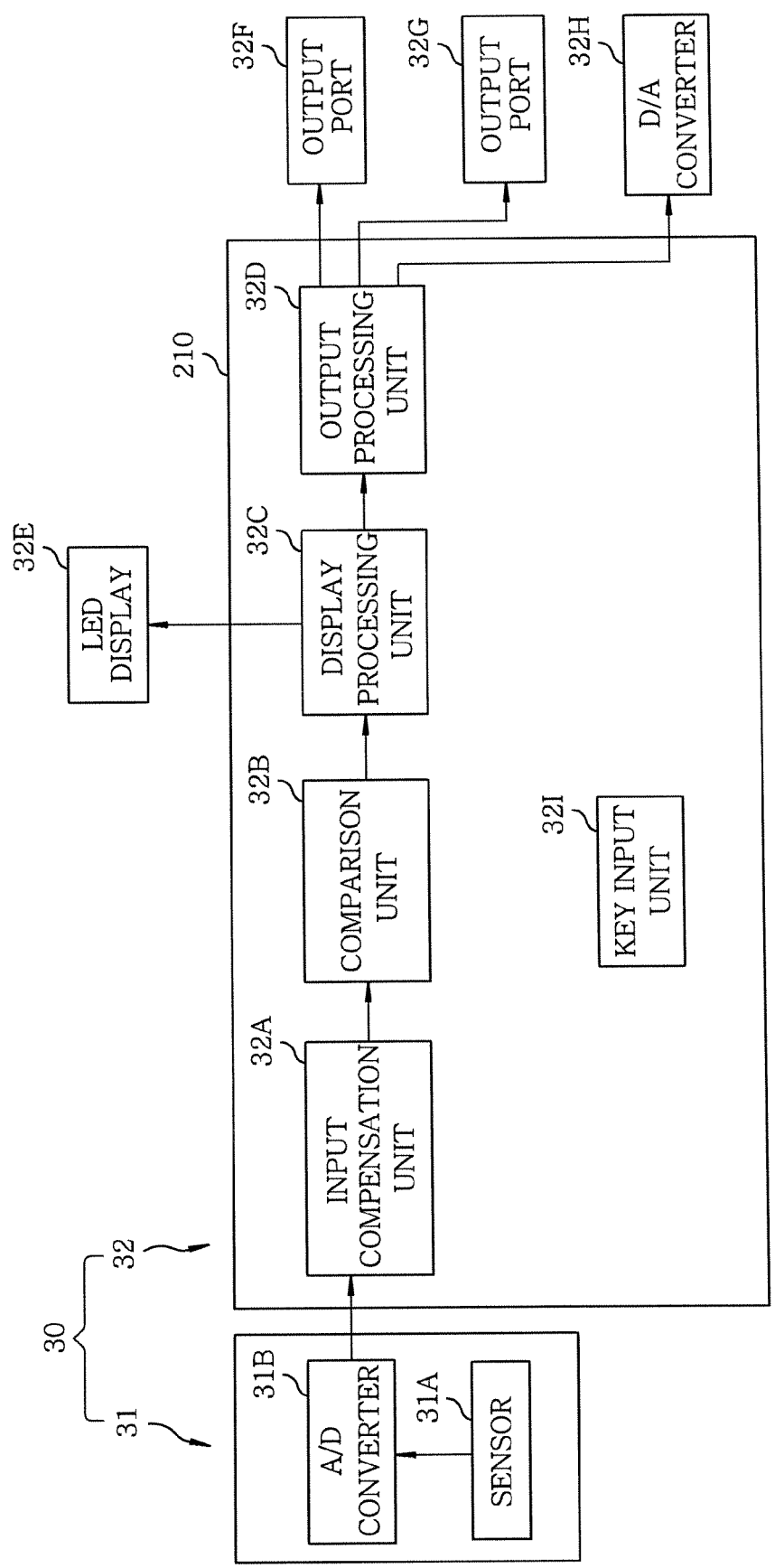

CHARGE ELIMINATING APPARATUS AND METHOD, AND PROGRAM STORAGE MEDIUM

FIELD OF THE INVENTION

The present invention relates to a charge eliminating apparatus and method, and a program storage medium; and, more particularly, to a charge eliminating apparatus and a charge eliminating method capable of eliminating an influence of a static electricity, which is charged on a target object, on an electrical characteristics test of the target object; and a program storage medium for storing therein a program for executing the charge eliminating method.

BACKGROUND OF THE INVENTION

One of post-processes for semiconductor manufacture is a process for testing a target object (e.g., a wafer) having a number of devices formed thereon by using a testing apparatus. The testing apparatus includes a loader chamber for transferring wafers accommodated in a cassette one by one; and a prober chamber for performing electrical characteristics tests of the wafers transferred from the loader chamber.

The loader chamber includes a wafer transfer mechanism that transfers the wafers one by one; and a pre-alignment mechanism (hereinafter referred to as a "sub chuck") that arranges a direction of each wafer by referring to an orientation flat or a notch of the wafer while the wafer is being transferred by the wafer transfer mechanism. Meanwhile, the prober chamber includes a mounting table (hereinafter referred to as a "main chuck") which moves in X, Y and Z directions and rotates forwardly or backwardly in θ direction while carrying the wafer thereon; a probe card disposed above the main chuck; and an alignment mechanism that aligns the wafer on the main chuck to probes of the probe card. Further, disposed at a head plate of the probe chamber is a test head which is brought into electrical contact with the probe card. A signal transfer is carried out between a tester and the probe card via the test head.

When a wafer test is performed, the wafer is carried out of the cassette by the wafer transfer mechanism and pre-aligned by the sub chuck in the loader chamber. After that, the wafer transfer mechanism mounts the wafer on the main chuck in the prober chamber. In the prober chamber, while the main chuck is moving in the X, Y, Z and θ directions, the alignment mechanism aligns the wafer to the probes of the probe card. Thereafter, the main chuck moves in the X and Y directions to position a first device on the wafer under the probes. Then, the main chuck moves up in the Z direction to thereby bring the device and the probes into electrical contact with each other, whereby performing a test of the first device. Upon the completion of the test of the first device, the main chuck moves down and performs an index feeding of the wafer so that the rest devices are tested subsequently. After the last device on the wafer is tested, the wafer is returned back to its original position inside the cassette via the main chuck and the wafer transfer mechanism, and, afterward, tests of rest wafers are performed subsequently.

During the test, static electricity is charged on the main chuck or the wafer due to an air friction generated when the main chuck moves or the like. This phenomenon is hard to avoid, and if not solved, there is a high likelihood that wiring structures of the devices might be damaged due to the influence of the static electricity during the test. In particular, with the recent trend of miniaturization of device structures, this problem is getting serious. Thus, Japanese Patent Laid-open Application No. 2003-218175 (Reference 1) proposes a charge eliminating mechanism for a main chuck. In this charge eliminating mechanism, the static electricity on the main chuck is eliminated while the wafer is being transferred between the wafer transfer mechanism and the main chuck.

With the charge eliminating mechanism in the Reference 1, however, the static electricity cannot be eliminated from the main chuck while the wafer test is being performed. That is, once a test of a single wafer is begun, the elimination of the static electricity cannot be performed until the test is finished. Accordingly, during the test of the single wafer, static electricity is gradually charged on the wafer and the main chuck. Therefore, with the progression of the test, there occurs a discrepancy in test results of devices, which results in deterioration of test reliability. In particular, with a recent device wiring structure made using a post-65-nm process, the influence of the static electricity becomes greater because a current applied during the test is very small. Thus, the influence of the static electricity upon the test result increases, resulting in deterioration of the test reliability, while causing a damage of the wiring structure in some extreme cases.

SUMMARY OF THE INVENTION

In view of the above, the present invention provides a charge eliminating apparatus and method capable of eliminating an influence of static electricity and improving test reliability for a target object having a highly miniaturized structure made using a post-65-nm process, while preventing a damage of a device on the target object. The present invention also provides a program storage medium for storing therein a program for executing the charge eliminating method.

In accordance with a first aspect of the present invention, there is provided a charge eliminating apparatus that eliminates, when an electrical characteristics test of a target object is performed by moving a mounting table mounting the target object thereon and a probe card relative to each other to bring the target object into electrical contact with the probe card, static electricity of the target object via the mounting table, the apparatus including:

a grounding wiring for grounding the mounting table;

a relay switch disposed on the grounding wiring; and a switch controller that controls the relay switch to be opened or closed.

It is preferable that the mounting table includes a top plate serving as a mounting surface on which the target object is mounted, and the grounding wiring is connected to a first conductive film formed on a top surface of the top plate.

It is preferable that the mounting table is connected to a test head via a cable, and the grounding wiring is electrically connected to a central conductor of the cable.

It is preferable that an external conductor of the cable is electrically connected to a second conductive film formed on a bottom surface of the top plate.

It is preferable that the external conductor of the cable is connected to a case accommodating the relay switch therein.

It is preferable that the relay switch is manually operable.

It is preferable that the charge eliminating apparatus further includes a charged state checking apparatus that checks a charged state of the target object.

It is preferable that the charged state checking apparatus includes a unit for setting an allowable range of a charged potential.

It is preferable that the charged state checking apparatus includes a unit for determining whether the charged potential falls out of the allowable range.

It is preferable that the charged state checking apparatus includes a unit for displaying the charged potential.

In accordance with a second aspect of the present invention, there is provided a charge eliminating method for eliminating, when an electrical characteristics test of a target object is performed by moving a mounting table mounting the target object thereon and a probe card relative to each other to bring the target object into electrical contact with the probe card, static electricity of the target object by using a relay switch installed on a grounding wiring of the mounting table, the method including:

eliminating the static electricity of the target object by grounding the mounting table by means of closing the relay switch when the target object is not in electrical contact with the probe card; and releasing the grounding of the mounting table by opening the relay switch when the target object is in electrical contact with the probe card.

It is preferable that eliminating the static electricity of the target object includes moving the probe card and the mounting table relative to each other.

It is preferable that eliminating the static electricity of the target object includes:

loading the target object on the mounting table; and aligning the target object to the probe card.

It is preferable that eliminating the static electricity of the target object includes unloading the target object from the mounting table.

It is preferable that releasing the grounding of the mounting table includes overdriving the target object by the mounting table.

It is preferable that the charge eliminating method further includes checking a charged state of the target object.

It is preferable that, checking a charged state of the target object is performed after aligning the target object.

In accordance with a third aspect of the present invention, there is provided a program storage medium for storing therein a computer-executable program for executing a charge eliminating method for eliminating, when an electrical characteristics test of a target object is performed by moving a mounting table mounting the target object thereon and a probe card relative to each other to bring the target object into electrical contact with the probe card, static electricity of the target object via the mounting table by using a relay switch installed on a grounding wiring of the mounting table, wherein the program executes:

eliminating the static electricity of the target object by grounding the mounting table by means of closing the relay switch when the target object is not in electrical contact with the probe card; and releasing the grounding of the mounting table by opening the relay switch when the target object is in electrical contact with the probe card.

It is preferable that the program executes checking a charged state of the target object.

In accordance with a fourth aspect of the present invention, there is provided a program, stored in a computer-readable storage medium, for executing the charge eliminating method of the second aspect.

In accordance with the present invention, there are provided a charge eliminating apparatus and method capable of eliminating an influence of static electricity and improving test reliability for a target object having a highly miniaturized structure made using a post-65-nm process, while preventing a damage of a device on the target object. The present invention also provides a program storage medium for storing therein a program for executing the charge eliminating method.

BRIEF DESCRIPTION OF THE DRAWINGS

The objects and features of the present invention will become apparent from the following description of embodiments given in conjunction with the accompanying drawings, in which:

FIG. 5 illustrates a block diagram of a controller of the charged state checking apparatus of FIG. 4.

DETAILED DESCRIPTION OF THE EMBODIMENTS

Hereinafter, an embodiment of the present invention will be described with reference to the accompanying drawings.

Figure 1:
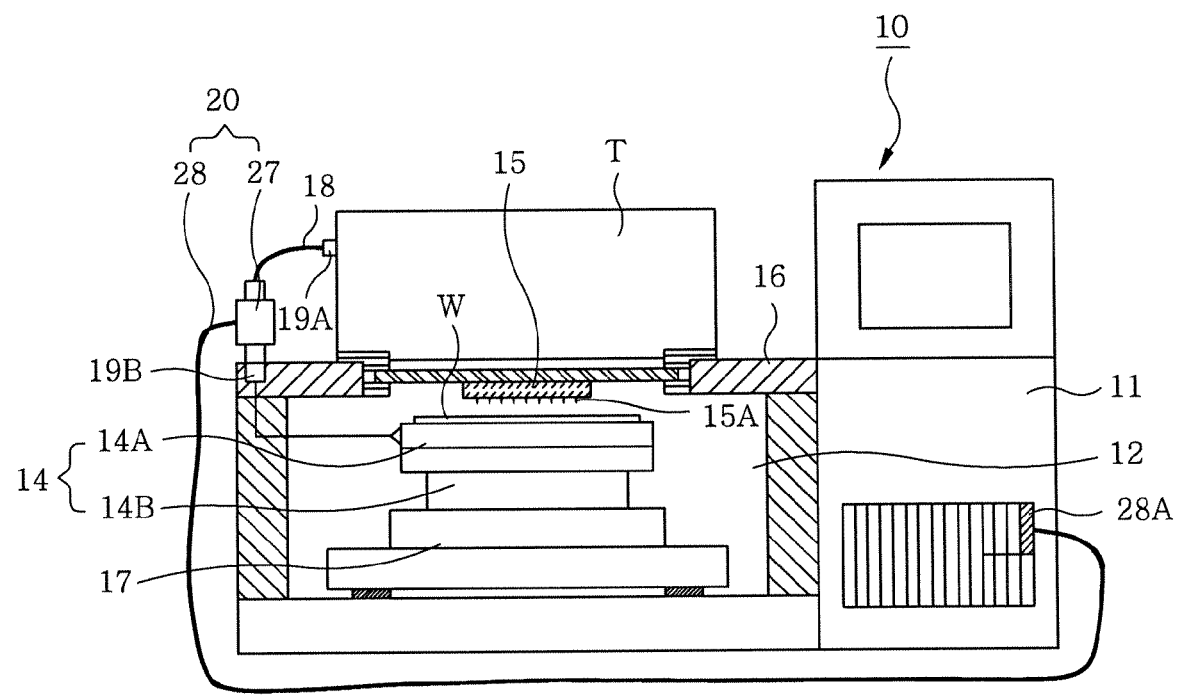
FIG. 1 illustrates a partially cut-away front view of an exemplary configuration of a testing apparatus which employs a charge eliminating apparatus in accordance with an embodiment of the present invention.

Referring to FIG. 1, a testing apparatus 10 equipped with a charge eliminating apparatus in accordance with the embodiment of the present invention includes a loader chamber 11 and a prober chamber 12, and serves to perform electrical characteristics tests of wafers W under the control of a controller (not shown).

As shown in FIG. 1, the loader chamber 11 includes a wafer accommodation unit (not shown) that accommodates a plurality of wafers W therein; a wafer transfer mechanism (not shown) that transfers the wafers W from/into the wafer accommodation unit; and a sub chuck (not shown) that performs a pre-alignment of the wafers W. In the loader chamber 11, while a wafer W is transferred by the wafer transfer mechanism, the wafer W is pre-aligned by the sub chuck, and the wafer W is transferred from the loader chamber 11 into the prober chamber 12.

As illustrated in FIG. 1, the prober chamber 12 includes a mounting table (hereinafter referred to as a "main chuck") 14 that mounts the wafer W thereon and moving in horizontal and vertical directions; a probe card 15 disposed above the main chuck 14; and an alignment mechanism (not shown) that aligns the wafer W on the main chuck 14 to a plurality of probes 15A of the probe card 15. In the prober chamber 12, after the wafer W on the main chuck 14 is aligned to the probes 15A of the probe card 15 by the alignment mechanism, the wafer W and the probes 15A are brought into electrical contact with each other, whereby the electrical characteristics test of the wafer W is performed. When performing the electrical characteristics test of the wafer W, a signal transfer is performed between a tester (not shown) and the probe card 15 via a test head T which is disposed on the top surface of the probe card 15. The probe card 15 is fixed at an opening portion of the head plate 16.

Figure 2:
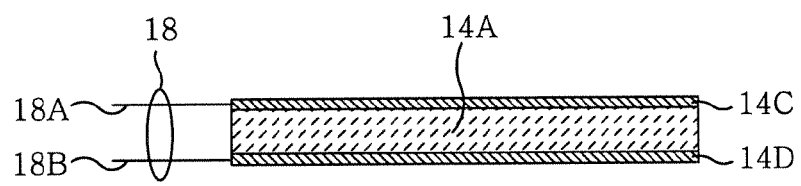
FIG. 2 illustrates a cross sectional view of a top plate of the testing apparatus of FIG. 1.

As illustrated in FIG. 1, the main chuck 14 includes a top plate 14A capable of, for example, vacuum-attracting the wafer W thereon; and an elevation mechanism 14B for moving the top plate 14A up and down. The main chuck 14 is moved in a horizontal direction by an XY table 17, while its top plate 14A is moved up and down by the elevation mechanism 14B. For example, as schematically illustrated in FIG. 2, the top plate 14A is made of an insulating plate such as ceramic, and a first conductive film 14C is formed on a top surface of the top plate 14A and a second conductive film 14D is formed on a bottom surface thereof. Each of the first and the second conductive film 14C and 14D is made of, e.g., a thin gold film.

Figure 3:
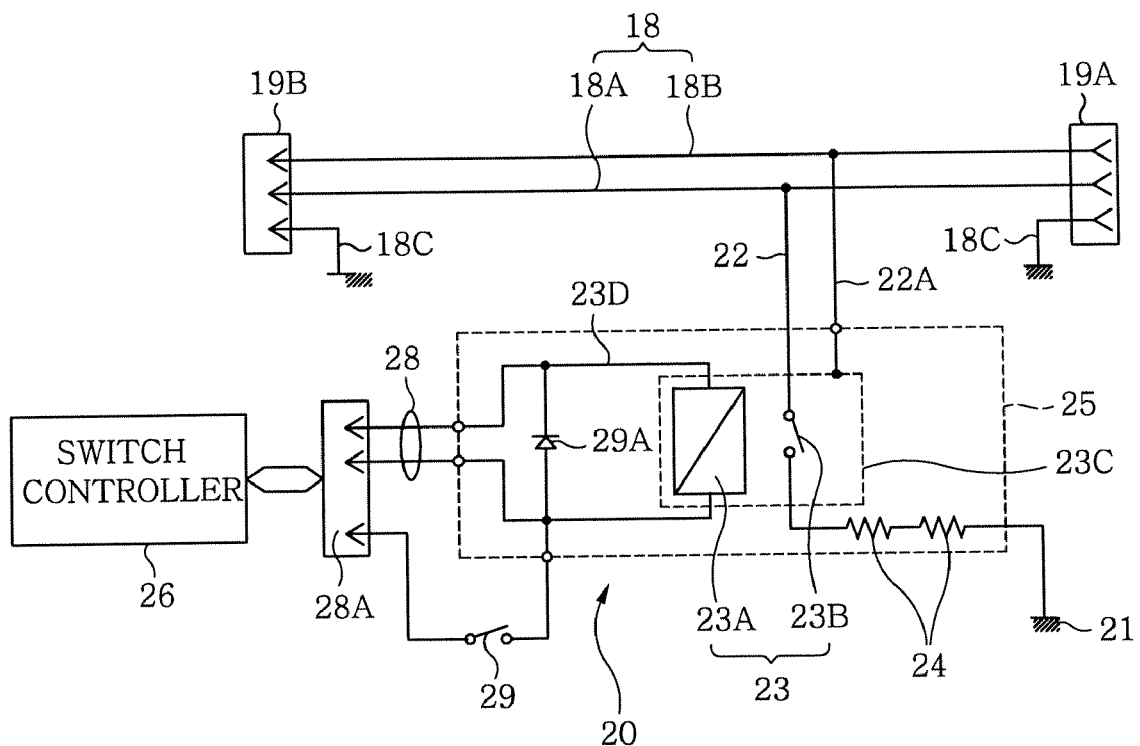
FIG. 3 illustrates a block diagram of the charge eliminating apparatus of FIG. 1.

Further, as shown in FIG. 1, the test head T is electrically connected to the top plate 14A via a cable 18 which is used for a measurement purpose. Referring to FIG. 3, the cable 18 includes, for example, a central conductor 18A serving as a transmission path for a measured voltage or a measured current; a first external conductor (e.g., a mesh-shaped first shield conductor) 18B covering the central conductor 18A via an insulating member; a second external conductor 18C (e.g., a mesh-shaped second shield conductor) covering the first shield conductor 18B via an insulating member. The cable 18 is electrically connected to the test head T via a first connector 19A, while it is also electrically connected to the top plate 14A side via a second connector 19B.

As shown in FIGS. 1 to 3, the central conductor 18A of the cable 18 is electrically connected to the first conductive film 14C of the top plate 14A, and the first shield conductor 18B is electrically connected to the second conductive film 14D of the top plate 14A. Further, the second shield conductor 18C of the cable 18 is grounded, as shown in FIG. 3. Accordingly, when the probe card 15 comes into electrical contact with the wafer W, the test head T transmits a test signal to the wafer W via the probe card 15 and concurrently sends a test signal to the first conductive film 14C on the top surface of the top plate 14A via the central conductor 18A of the cable 18, whereby the electrical characteristics test of the wafer W is performed.

When the test of the wafer W is performed, static electricity is charged on devices formed on the wafer W, and this static electricity may have an adverse effect on the tests of the devices. Thus, in this embodiment, a charge eliminating apparatus 20 shown in FIGS. 1 and 3 is provided to eliminate the static electricity charged on the wafer W. Hereinafter, the charge eliminating apparatus 20 and a charge eliminating method using same will be explained in accordance with an embodiment of the present invention. A program for use in performing the charge eliminating method of the present invention is stored in a storage unit of a computer which is a control unit, and by driving the computer, the program is executed.

The charge eliminating apparatus 20 in accordance with the embodiment of the present invention includes, as illustrated in FIGS. 1 and 3, a grounding wiring 22 whose two opposite ends are connected to the central conductor 18A of the cable 18 and earth 21, respectively; a relay switch 23 installed on the grounding wiring 22; grounded resistors 24 disposed between the earth 21 and the relay switch 23; a support board 25 supporting the relay switch 23 and the grounded resistors 24; a switch controller 26 that controls the relay switch 23 to be opened or closed; and a housing 27 accommodating all these components other than the switch controller 26. While the test of the wafer W is being performed, the relay switch 23 is opened and closed regularly under the control of the switch controller 26 so that the static electricity charged on the top plate 14 may be eliminated. The charge eliminating apparatus 20 is installed at the head plate 16 via the housing 27, as illustrated in FIG. 1.

The relay switch 23 includes, as shown in FIG. 3, a coil 23A; a switch 23B disposed in the coil 23A in parallel with an axis thereof; and a case 23C accommodating the coil 23A therein. The relay switch 23 is operated based on a signal from the switch controller 26. Further, the coil 23A is electrically connected to a controller cable 28 via a wiring 23D. The controller cable 28 is electrically connected to the switch controller 26 via an I/O port 28A. Moreover, one end of the switch 23B is electrically connected to the grounding wiring 22. The switch 23B serves to electrically connect the central conductor 18A of the cable 18 to the earth 21 when an electromotive force is applied to the coil 23A based on a signal from the switch controller 26, and it releases the connection between the central conductor 18A of the cable 18 and the earth 21 if the electromotive force applied upon the coil 23A disappears.

Further, since the first shield conductor 18B of the cable 18 is extended to a vicinity of the switch 23B via a wiring 22A and is electrically to the case 23C, a leakage current or an electrical noise from the grounding wiring 22 or the switch 23B can be suppressed by setting the switch 23B and the case 23C to be substantially equipotential to each other. Furthermore, since the first shield conductor 18B of the cable 18 is electrically connected to the second conductive film 14D on the bottom surface of the top plate 14A, substantially same voltage as that applied to the first conductive film 14C can be applied to the second conductive film 14D. As a result, a leakage current from the first conductive film 14C is suppressed, whereby the accuracy of the device measurement can be improved.

The switch controller 26 may be implemented in the form of a program serving as a part of a control unit made of a computer. The switch controller 26 may be stored in the control unit via a storage medium which stores therein a program for executing the charge eliminating method in accordance with the embodiment of the present invention.

Figure 4:
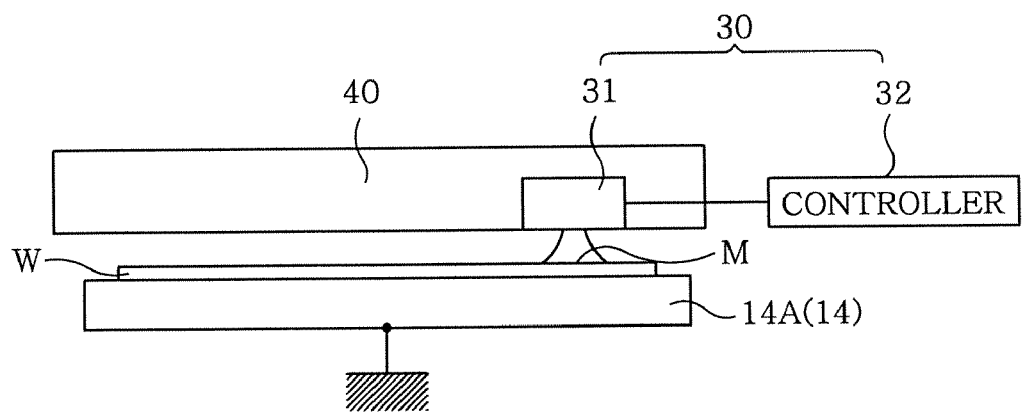
FIG. 4 illustrates a block diagram of a charged state checking apparatus attached to an alignment bridge of the testing apparatus of FIG. 1.

Further, a button switch 29 is installed at the housing 27 of the charge eliminating apparatus 20. If an operator presses the button switch 29, an electromotive force is applied to the relay switch 23, so that charge elimination is performed. The button switch 29 is, as shown in FIG. 3, electrically connected to the wiring 23D of the coil 23A via a diode 29A. The button switch 29 is not used during the test of the wafer W, but it is used, e.g., during a maintenance work. Further, the charge eliminating apparatus 20 includes a charged state checking apparatus 30, as shown in FIGS. 4 and 5, that checks a charged state of the wafer W. The charged state checking apparatus 30 serves to check the charged state of the wafer W, and it is used to prevent an adverse influence of the static electricity charged on the wafer W upon the test.

Now, the charged state checking apparatus 30 will be explained in further detail. The charged state checking apparatus 30 includes, as shown in FIG. 4, a surface potential sensor 31 installed at an alignment bridge 40 of the alignment mechanism; and a controller 32 connected to the surface potential sensor 31, wherein the surface potential sensor 31 serves to detect a surface potential of the wafer W. The surface potential sensor 31 is distanced apart from a measurement surface M of the wafer W by a specific interval (e.g., several millimeters) and detects a potential of the measurement surface M of the wafer W. To use this charged state checking apparatus 30, a threshold value of the surface potential needs to be set in the controller 32 in advance, and a zero adjustment needs to be performed in advance, too.

The surface potential sensor 31 includes, as shown in FIG. 5, a sensor unit 31A and an A/D converter 31B. The sensor unit 31A measures the surface potential of the wafer W, and a measurement signal thus obtained is transmitted to the controller 32 via the A/D converter 31B. The controller 32 includes, as shown in FIG. 5, an input compensation unit 32A, a comparison unit 32B, a display processing unit 32C and an output processing unit 32D. The controller 32 allows the operator to check the surface potential of the wafer W measured by the surface potential sensor 31. Hereinafter, each component of the controller 32 will be described.

The input compensation unit 32A calculates a mean value of surface potentials based on measurement signals inputted from the surface potential sensor 32 during a certain period time, and obtains an original surface potential by performing compensation to the mean value. Then, the input compensation unit 32A sends a processing signal representing the original surface potential to the comparison unit 32B. The comparison unit 32B compares the surface potential represented by the processing signal from the input compensation unit with the surface potential threshold value which is set in advance. Then, the comparison unit 32B determines whether the current surface potential falls within a range from a minus threshold value and a plus threshold value (allowable range), and sends a determination signal to the display processing unit 32C.

The display processing unit 32C conducts a process for displaying the determination signal from the comparison unit 32B on an LED display 32E. The LED display 32E displays a surface potential within the allowable range and a surface potential out of the allowable range by different colors. As for a display means, other means than the LED display 32E may be used. The output processing unit 32D outputs ON/OFF signals through different output ports 32F and 32G according to the determination signal which indicates whether the surface potential falls within the allowable range or not. The output processing unit 32D outputs the potential surface as an analog signal via the D/A converter 32H. The output port 32F outputs an ON signal at a surface potential within the allowable range; and otherwise, it outputs an OFF signal. On the contrary, the output port 32G outputs an OFF signal at a surface potential within the allowable range; and otherwise, it outputs an ON signal.

The controller 32 includes, as shown in FIG. 5, a key input unit 32I. The key input unit 32I is used to input the threshold value and the like.

Figure 6A:
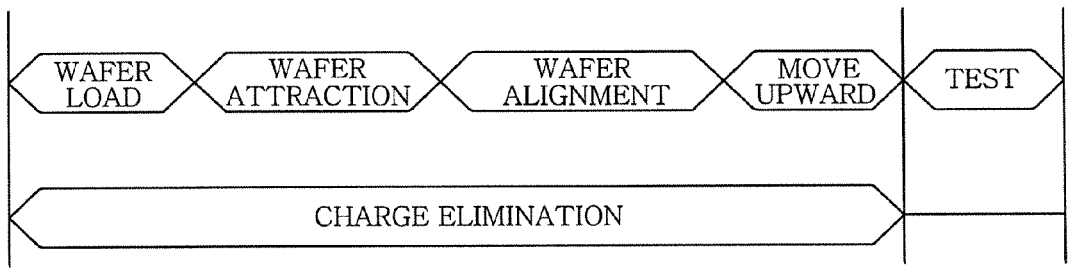
FIGS. 6A to 6C respectively illustrate timing charts of a charge eliminating method for a wafer.
Figure 6B:
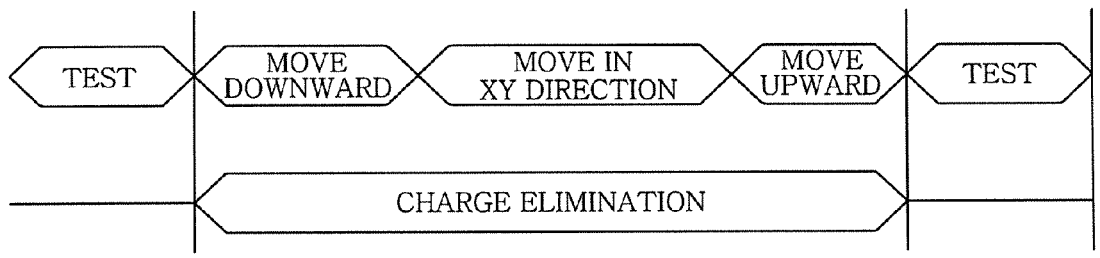
Figure 6C:
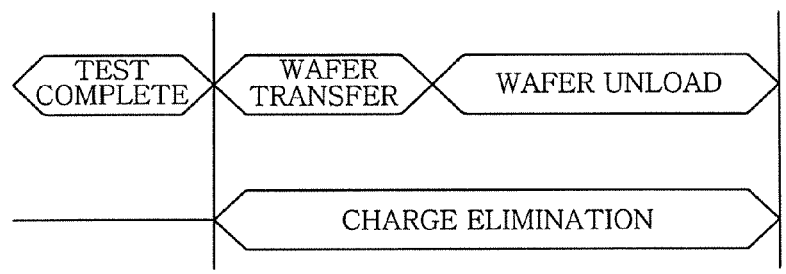

Now, there will be described the charge eliminating method performed by using the charge eliminating apparatus 20 in accordance with the embodiment of the present invention with reference to FIGS. 6A to 6C. The charge eliminating method of the present invention may be performed by executing on a computer a program for performing the method.

When a test of a wafer W is performed, in the loader chamber 11, the wafer W is unloaded from the wafer accommodation unit by the wafer transfer mechanism and is pre-aligned by the sub chuck. Then, the wafer W is loaded on the main chuck 14 which is waiting in the prober chamber 12. During the time period in which the wafer W is transferred from the wafer accommodation unit onto the top plate 14A of the main chuck 14, the switch controller 26 is operated as shown in FIG. 6A, to thereby apply an electromotive force to the relay switch 23B. As a result of the application of the electromotive force to the relay switch 23, the switch 23B is closed, and the first conductive film 14C of the top plate 14A is grounded via the central conductor 18A of the cable 18 and the grounding wiring 22. As a result, static electricity charged on the top plate 14A is eliminated.

If the wafer transfer mechanism loads the wafer W onto the top plate 14A, the top plate 14A vacuum-attracts the wafer W thereon, and the main chuck 14 moves in horizontal direction. If the wafer W is fixedly attracted on the top plate 14A, the static electricity that has been so far charged on the wafer via the top plate 14A is eliminated via the top plate 14A. On the move, the main chuck 14 cooperates with the alignment mechanism to align the wafer W to the probes 15A of the probe card 15. Though the charging of the static electricity on the wafer W and the top plate 14A is also attempted during this operation, the static electricity on the wafer W and the top plate 14A is eliminated via the top plate 14A until the wafer W is brought into contact with the probes 15A, because the top plate 14A is grounded. Thus, no static electricity is charged on the wafer W.

However, it is assumed that there rises an occasion that the static electricity is not sufficiently eliminated from the wafer W. If the static electricity it not sufficiently eliminated and so the charged wafer W is directly subjected to the test, an accurate test cannot be accomplished and damages on the devices may be resulted depending on the charged state of the wafer W. Therefore, in the charge eliminating method in accordance with the present embodiment, the charged state checking apparatus 30 installed at the alignment bridge 40 is operated upon the completion of the alignment process and investigates the charged state of the wafer W.

At this time, the main chuck 14 moves under the surface potential sensor 31 of the charged state checking apparatus 30 and stops at plural locations that are distanced away from each other by a specific distance. At each location, the sensor unit 31A of the surface potential sensor 31 measures a charged potential of the wafer W. After the surface potentials are thus measured by the surface potential sensor 31, the measurement signals are outputted to the controller 32 via the A/D converter 31B.

The measurement signals are inputted to the input compensation unit 32A of the controller 32. The input compensation unit 32A calculates a mean value of the surface potentials based on the measurement signals, obtains an original surface potential by performing compensation to the mean value, and transmits a processing signal to the comparison unit 32B. The comparison unit 32B compares the surface potential represented by the processing signal from the input compensation unit 32A with the preset surface potential threshold value and determines whether the surface potential falls within the allowable range. Then, the comparison unit 32B sends a determination signal to the display processing unit 32C.

The display processing unit 32C performs a signal processing of the determination signal provided from the comparison unit 32B and displays the surface potential on the LED display 32E. By seeing the LED display 32E, the operator can determine whether the current surface potential of the wafer W is within the allowable range simply by checking displaying colors and can also be informed of the exact value of the surface potential.

The output processing unit 32D outputs an ON signal from the output port 32F when the surface potential indicated by the determination signal is within the allowable range, whereas it outputs an OFF signal from the output port 32F when the surface potential is out of the allowable range. Further, the output processing unit 32D outputs an OFF signal from the output port 32G when the surface potential indicated by the determination signal falls within the allowable range, and otherwise, it outputs an ON signal from the output port 32G. Moreover, the output processing unit 32D outputs the determination signal as an analog signal via the D/A converter 32H.

Accordingly, if the wafer W is charged with the static electricity after its alignment is completed, the charged state of the wafer W can be investigated simply and rapidly by means of the charged state checking apparatus 30. According to the charged state of the wafer W, the charge elimination is performed again before the wafer W is subjected to the test process.

After the alignment of the wafer W is completed, if the wafer W is not charged or if the surface potential of the wafer W is within the allowable range even though the wafer W is charged, the wafer test process is started. In the test process, a first device on the wafer W is located under the probes 15A, and the elevation mechanism 14B of the main chuck 14 is driven to move the wafer W upward to thereby allow the device to contact the probes 15A. The moment the contact is made, the switch controller 26 is operated to remove the electromotive force applied to the relay switch 23, whereby the switch 23B is opened and the grounding of the top plate 14A is released. As result, the charge elimination from the wafer W and the top plate 14A is stopped.

After the device is brought into contact with the probes 15A, the wafer W is overdriven by the elevation mechanism 14B of the main chuck 14, so that the wafer W and the probes 15A are electrically connected with each other. Then, test signals are transmitted from the tester to the probe card 15 via the test head T and, at the same time, a voltage as a test signal is applied from the test head T to the first conductive film 14C on the top surface of the top plate 14A via the central conductor 18A of the cable 18, whereby the electrical characteristics test of the device is carried out. At this time, substantially same voltage as that applied to the first conductive film 14C is applied to the second conductive film 14D on the bottom surface of the top plate 14A.

Accordingly, a leakage current from the first conductive film 14C is prevented from being generated, whereby the accuracy of the device measurement can be improved. Further, since the second conductive film 14D on the bottom surface of the top plate 14A is electrically connected with the case 23C via the first shield conductor 18B of the cable 18 and the wiring 22A, the switch 23B disposed on the grounding wiring 22 and the case 23C can be made to be substantially equipotential to each other, so that a leakage current or an electrical noises from the grounding wiring 22 and/or the switch 23B can be prevented.

If the test of the first device is completed, the top plate 14A is moved downward by the elevation mechanism 14B, so that the contact between the device and the probes 15A is released. Concurrently with this descending operation, the relay switch 23 is operated in response to a command signal from the switch controller 26 and closes the switch 23B, whereby the first conductive film 14C of the top plate 14A is grounded, so that static electricity charged on the wafer W and the top plate 14A during the test is eliminated via the top plate 14A, as shown in FIG. 6B Then, the main chuck 14 moves in the X or the Y direction to index-feed the wafer W, and if a next target device to be tested is located under the probes 15A, the top plate 14A is moved upward by the elevation mechanism 15B, so that the device and the probes 15 are brought into electrical contact with each other. Between the descending operation of the top plate 14A and this contact operation, static electricity of the wafer W and the top plate 14A is eliminated via the top plate 14A. The moment the device comes into contact with the probes 15A, the relay switch 23 is operated in response to a command signal from the switch controller 26, whereby the switch 23B is opened, and the charge elimination from the top plate 14A is stopped. In this state, test signals are transmitted from the test head T via the probes 15A, and the electrical characteristics test of the target device is repeated.

After a test of a final device on the wafer W is performed, the top plate 14A is descended. Concurrently with this descending operation, the switch 23B of the relay switch 23 is closed in response to a command signal from the switch controller 26, so that a charge elimination of the wafer W and the top plate 14A is performed (see FIG. 6C). Then, the main chuck 14 is moved toward the loader chamber 11 for the transfer of the tested and charge-eliminated wafer W into the loader chamber 11. The wafer transfer mechanism that is standing by in the loader chamber 11 then unloads the wafer W from the main chuck 14. Then, the wafer transfer mechanism returns the tested wafer W back into the wafer accommodation unit and unloads a next target wafer W to be tested from the accommodation unit.

Moreover, the wafer transfer mechanism transfers a wafer W, which is pre-aligned by the sub chuck, to the main chuck 14 which is standing by in the prober chamber 12. After the wafer W is loaded on the main chuck 14, the above-described operations are repeated to perform the test of the wafer W, while eliminating charges from the wafer W and the top plate 14A during the wafer W and the probes 15A are not in electrical contact with each other. Further, it is also possible to use a wafer transfer mechanism having an upper arm and a lower arm. In such case, one arm of the transfer mechanism can be used to unload a wafer W from the wafer accommodation unit, pre-align the wafer W and to wait for a tested wafer W to arrive, while carrying the pre-aligned wafer thereon. If the tested wafer W is provided to the wafer transfer mechanism, the other arm performs an unloading of the tested wafer W while said one arm performs a loading of the pre-aligned wafer.

As described above, in most time except when the wafer W and the probes 15 are in contact with each other, the static electricity of the wafer W and the top plate 14A is eliminated via the top plate 14A. Thus, there is little opportunity where the static electricity is charged on the wafer W, and the wafer W can be maintained to have a substantially same and small quantity of electric charge all through the process for testing the first to the final device thereon. Therefore, since there is little discrepancy in the results of the test of the first to the final device, a highly reliable test can be carried out. Moreover, since the quantity of the electric charge on the wafer W is small, there is no probability that the devices are damaged during the test.

For example, even when the charge of the wafer W is not sufficiently eliminated prior to the beginning of the test, and so if the charged electricity exceeds the allowable range, the abnormal charged state of the wafer W can be found by using the charged state checking apparatus 30, immediately after the alignment of the wafer W and immediately before the test thereof. Accordingly, a highly reliable test can always be performed without causing any damage on the devices during the test.

In accordance with the present embodiment described above, the charge eliminating apparatus 20 includes the grounding wiring 22 for grounding the main chuck 14; the relay switch 23 installed on the grounding wiring 22; and the switch controller 26 that controls the opening/closing of the relay switch 23. The charge eliminating apparatus 20 can perform a process of eliminating the static electricity of the wafer W and the top plate 14A by grounding the top plate 14A of the main chuck 14 by means of closing the relay switch 23 when the wafer W is not in electrical contact with the probes 15A. The charge eliminating apparatus 20 can also carry out a process of releasing the grounding of the top plate 14A by opening the relay switch 23 when the wafer W and the probes 15A are in electrical contact with each other. Therefore, little static electricity is charged on the wafer W during the test of the wafer W. As a result, even for a wafer W having a highly miniaturized structure made using a post-65-nm process, test reliability can be improved and a damage of the wiring structure of the devices can be prevented effectively.

Moreover, in accordance with the present embodiment, since the top plate 14A of the main chuck 14 is connected to the test head T via the cable 18 while the grounding wiring 22 is electrically connected to the central conductor 18A of the cable 18, it is possible to use the central conductor 18A of the cable 18 as a grounding wiring of the charge eliminating apparatus 20.

Further, in accordance with the present embodiment, since the first shield conductor 18B of the cable 18 is electrically connected to the case 23C of the relay switch 23 via the wiring 22A, it is possible to prevent a generation of a leakage current or an electrical noise by setting the switch 23B and the case 23C to be substantially equipotential to each other. Furthermore, since the first shield conductor 18B is connected to the second conductive film 14D on the bottom surface of the top plate 14A, a substantially same voltage as that applied to the first conductive film 14C can be applied to the second conductive film 14D, whereby a leakage current from the first conductive film 14C can be prevented, and the accuracy of the device test can be improved. Further, since the relay switch 23 is connected to the button switch 29 and can be manually operable, static electricity can be rapidly eliminated by manipulating the button switch 29 in an emergent situation where a problem occurs due to the static electricity during the test.

In accordance with the present embodiment described above, since the charged state of the wafer W is tested by using the charged state checking apparatus 30 immediately after the alignment of the wafer W is completed, the charged state of the wafer W immediately before the test of the wafer W starts can be checked. If there is no abnormality in the charged state of the wafer W, the test is immediately performed, whereas, if there is any abnormality in the charged state of the wafer W, charge elimination is performed prior to starting the test. Therefore, a highly reliable test can be carried out, and a damage of devices on the wafer W due to the abnormality in the charged state of the wafer W can be prevented during the test.

Further, in accordance with the present embodiment, since the charged state checking apparatus 30 has the key input unit 32I for the operator to input the allowable range for the charged potential of the wafer W, the comparison unit 32B can determine whether the current charged state of the wafer W is normal or not based on the threshold values. Since the determination result of the comparison unit 32B is displayed on the LED display 32E via the display processing unit 32C, the operator can be informed of the charged degree of the wafer W by seeing the LED display 32E. If the determination result from the comparison unit 32B deviate from the allowable range of the charged potential of the wafer W, the fact is displayed on the LED display 32E so that the operator can take a measure of, e.g., performing charge elimination.

In addition, though the embodiment of the present invention has been described for the case of using the testing apparatus in which the main chuck (mounting table) moves relative to the probe card, it is also possible to use a testing apparatus in which the probe card moves with respect to the mounting table. Further, though the charge eliminating apparatus of the present invention is applied to the wafer testing apparatus in the above embodiment, it can also be applied to another apparatus for testing a target object other than the wafer. Moreover, though the charge eliminating apparatus is installed at the alignment bridge and the investigation of the charged state of the wafer W is performed right after the completion of the alignment in the above embodiment, the inspection of the charged state of the wafer W can be performed at other proper timings, and the installation place for the charge eliminating apparatus is not limited to the alignment bridge as far as the surface potential of the target object can be checked by the operator.

The present invention can be properly applied to a testing apparatus in the semiconductor manufacturing field.

While the invention has been shown and described with respect to the embodiments, it will be understood by those skilled in the art that various changes and modifications may be made without departing from the scope of the invention as defined in the following claims.

What is claimed is:

1. A charge eliminating apparatus that eliminates, when an electrical characteristics test of a target object is performed by moving a mounting table mounting the target object thereon and a probe card relative to each other to bring the target object into electrical contact with the probe card, static electricity of the target object via the mounting table, the apparatus comprising:
   a grounding wiring to ground the mounting table;
   a relay switch disposed on the grounding wiring; and
   a switch controller to drive the relay switch to be opened or closed while performing the electrical characteristics test of the target object, wherein
   the mounting table includes a top plate serving as a mounting surface on which the target object is mounted, and the grounding wiring is connected to a first conductive film formed on a top surface of the top plate.

2. The charge eliminating apparatus of claim 1, wherein the mounting table is connected to a test head via a cable, and the grounding wiring is electrically connected to a central conductor of the cable.

3. The charge eliminating apparatus of claim 2, wherein an external conductor of the cable is electrically connected to a second conductive film formed on a bottom surface of the top plate.

4. The charge eliminating apparatus of claim 3, wherein the external conductor of the cable is connected to a case accommodating the relay switch therein.

5. The charge eliminating apparatus of claim 1, further comprising a manually operable switch disposed between the relay switch and the switch controller.

6. The charge eliminating apparatus of claim 1, wherein the switch controller drives the relay switch to be closed before starting the electrical characteristics test.

* * * * *